(12) United States Patent
Lin

(10) Patent No.: US 7,662,672 B2
(45) Date of Patent: Feb. 16, 2010

(54) MANUFACTURING PROCESS OF LEADFRAME-BASED BGA PACKAGES

(75) Inventor: Hung-Tsun Lin, Tainan (TW)

(73) Assignees: ChipMos Technologies (Bermuda) Ltd., Hamilton HM (BM); ChipMos Technologies Inc., Hsinchu (TW)

( * ) Notice: Subject to any disclaimer, the term of this patent is extended or adjusted under 35 U.S.C. 154(b) by 32 days.

(21) Appl. No.: 12/153,451

(22) Filed: May 19, 2008

(65) Prior Publication Data

US 2009/0087953 A1 Apr. 2, 2009

Related U.S. Application Data

(63) Continuation-in-part of application No. 11/580,310, filed on Oct. 13, 2006, now Pat. No. 7,579,676.

(51) Int. Cl.
*H01L 21/00* (2006.01)

(52) U.S. Cl. .................. 438/123; 438/110; 438/111; 438/112; 438/113; 438/124; 438/125; 438/126; 438/127; 438/12; 438/13; 438/39; 438/40; 438/41; 438/42; 438/43; 438/44; 438/458; 438/459; 438/626; 438/633; 438/689; 438/690; 438/757; 438/940; 438/959; 257/666; 257/667; 257/668; 257/669; 257/670; 257/671; 257/672; 257/673; 257/674; 257/675; 257/676; 257/677; 257/678; 257/E23.031; 257/E23.032; 257/E23.02; 257/E23.023; 257/E23.013; 257/E23.04; 257/E23.042

(58) Field of Classification Search .............. 438/111, 438/112, 123, FOR. 366, FOR. 367, FOR. 377, 438/FOR. 380, 12, 13, 39–44, 115, 458, 459, 438/626, 631, 633, 689–757, 759, 940, 959, 438/963, 977, FOR. 100–FOR. 134, FOR. 370, 438/FOR. 385–FOR. 406, FOR. 485; 257/666–677, 257/E23.031–23.059, E23.004, E23.043–23.05
See application file for complete search history.

(56) References Cited

U.S. PATENT DOCUMENTS 6,001,671 A * 12/1999 Fjelstad ................... 438/112
6,964,918 B1 * 11/2005 Fan et al. ................. 438/614

* cited by examiner

*Primary Examiner*—Charles D Garber
*Assistant Examiner*—Yasser A Abdelaziez
(74) *Attorney, Agent, or Firm*—WPAT, P.C.; Anthony King; Kay Yang

(57) ABSTRACT

A manufacturing process of a leadframe-based BGA package is disclosed. A leadless leadframe with an upper layer and a lower layer is provided for the package. The upper layer includes a plurality of ball pads, and the lower layer includes a plurality of sacrificial pads aligning and connecting with the ball pads. A plurality of leads are formed in either the upper layer or the lower layer to interconnect the ball pads or the sacrificial pads. An encapsulant is formed to embed the ball pads after chip attachment and electrical connections. During manufacturing process, a half-etching process is performed after encapsulation to remove the sacrificial pads to make the ball pads electrically isolated and exposed from the encapsulant for solder ball placement where the soldering areas of the ball pads are defined without the need of solder mask(s) to solve the problem of solder bleeding of the solder balls on the leads or the undesired spots during reflow. Moreover, mold flash can easily be detected and removed.

19 Claims, 11 Drawing Sheets

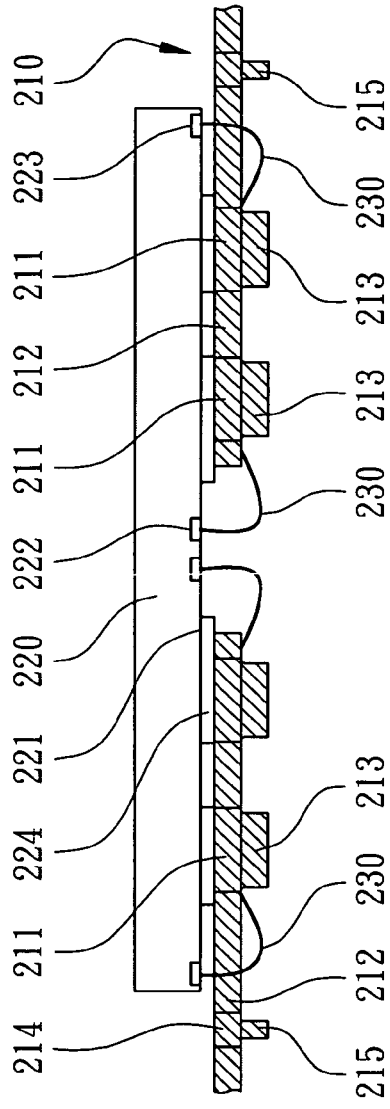
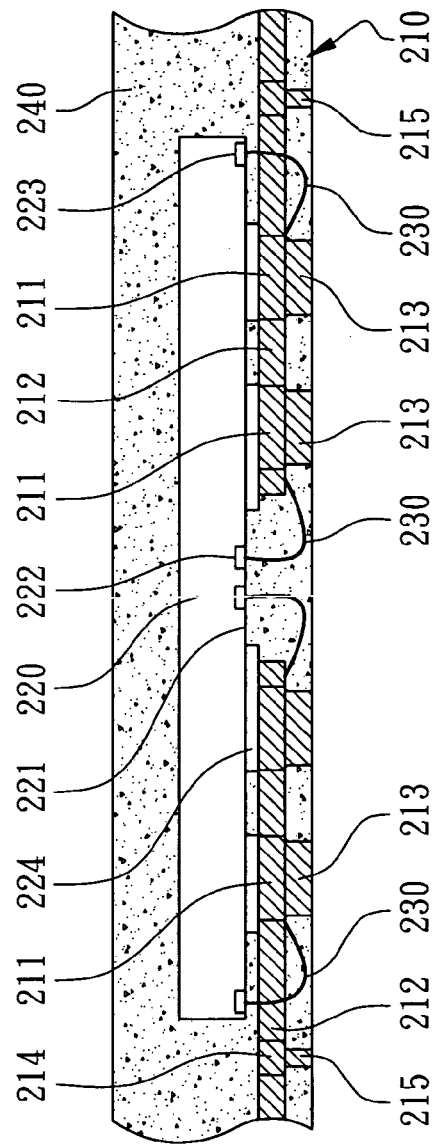

MANUFACTURING PROCESS OF LEADFRAME-BASED BGA PACKAGES

CROSS REFERENCE TO RELATED APPLICATIONS

This is a continuation-in-part of U.S. patent application Ser. No. 11/580,310, filed Oct. 13, 2006 now U.S. Pat. No. 7,579,676.

FIELD OF THE INVENTION

The present invention relates to fabrication technology of semiconductor devices, and more particularly, to a manufacturing process of leadframe-based BGA (Ball Grid Array) packages.

BACKGROUND OF THE INVENTION

Leadframe-based Ball Grid Array (LFBGA) has the advantages of higher packaging density, lower manufacturing cost, and better thermal dissipation. Leadless leadframes replace the traditional printed circuit boards or ceramic substrates with solder balls disposed on the leads of the leadframes. The solder balls are disposed in an array or in multiple rows to provide electrical connections to an external printed circuit board by SMT. Related technologies have been disclosed by R.O.C. Taiwan Patent No. 529770 and 584316.

A reflowing process is required for leadframe-based BGA to solder the solder balls on the leads of the leadframe. However, the reflow temperature to ensure good wetting of the solder balls may cause unrestrained bleeding of the fused solder to the undesired spots, leading to the insufficient heights of the solder balls or even bridging between the leads. A solution is provided by half-etching the leadframes so that only the soldering areas of the leads protrude from the other portions of the leads before die-attaching and molding processes, followed by an encapsulation process in a manner that the other portions of the leads are concealed by the encapsulant and the soldering areas of the leads are exposed from the bottom of the encapsulant. However, during encapsulation, the leadframes are laid on the molding chest or adhesive tapes with only the protruded soldering areas of the leads in contact with the supporting surfaces of the molding chest or tapes, and mold flashes therefore become an issue. Moreover, since the soldering areas of the leads and the bottom surface of the encapsulant are on the same plane so that mold flash can not easily be detected and removed leading to weakening soldering strength and dropping of solder balls.

Conventional manufacturing processes of leadframe-based BGA packages are disclosed in R.O.C. Taiwan Patent No. 567566. A non-conductive film with through holes to expose the soldering areas of the leads is attached to the bottom surface of the leadframe to serve as the solder mask. Since there are gaps between the leads, the non-conductive film must be pre-formed in compliance with the layout of the leads where extra costs are incurred due to the application of this additional material. Furthermore, when attaching the pre-formed non-conductive film on the leadframe, accurate alignment between through holes and the soldering areas is required. Once the through holes of the non-conductive film are not completely covered by the leads, encapsulant may flow into the through holes leading to failure of solder ball joint.

SUMMARY OF THE INVENTION

The main purpose of the present invention is to provide a manufacturing process of leadframe-based BGA packages. A leadless leadframe has a two-layer structure. After encapsulation and before jointing solder ball, a half-etching process is performed to remove sacrificial pads of the leadless leadframe and to make the ball pads of the leadless leadframe electrically isolated and embedded in the encapsulant with their bottom surfaces exposed from the encapsulant to define and control the soldering areas of the ball pads without any solder mask. Moreover, bleeding of the solder balls on the ball pads during reflowing can be avoided and the mold flash at the bottom surface of the encapsulant can easily be detected and removed.

The second purpose of the present invention is to provide a manufacturing process of leadframe-based BGA packages where a leadless leadframe not only has leads and ball pads, but also has a plurality of sacrificial pads in a lower layer aligning and connecting with the ball pads. During the half-etching process, the sacrificial pads are removed to form a plurality of cavities on the bottom of encapsulant which expose the bottom surfaces of the ball pads and are to be filled with solder balls after reflowing to increase the soldering strength of the solder balls.

The third purpose of the present invention is to provide a manufacturing process of leadframe-based BGA packages where a leadless leadframe further includes a die pad and a plurality of tie bars connecting to the die pad. The tie bars are formed in a lower layer of the leadless leadframe. During the half-etching process, the tie bars are removed along with the leads to prevent solder diffusion under the die pad.

The manufacturing process of a leadframe-based BGA package according to the present invention is provided. Firstly, a leadless leadframe having an upper layer and a lower layer where a plurality of ball pads are formed in the upper layer and a plurality of sacrificial pads are formed in the lower layer is provided. The sacrificial pads align and connect with the ball pads. The leadless leadframe further includes a plurality of leads in either the lower layer or the upper layer. Then, during a die-attaching step, at least a chip is attached onto the upper layer of the leadless leadframe. During or after the die-attaching step, the chip is electrically connected to the leadless leadframe. Then, during encapsulation, an encapsulant is formed on the leadless leadframe so that the ball pads are embedded inside the encapsulant and the bottom surfaces of the sacrificial pads are exposed from the bottom of the encapsulant. In the half-etching process after encapsulation, the sacrificial pads even with the leads are removed to make the embedded ball pads electrically isolated and their bottom surfaces partially exposed from the encapsulant. Then, a plurality of solder balls are jointed on the ball pads. Therefore, the ball jointing areas of the ball pads can be defined without any solder mask. Moreover, mold flash can easily be detected and removed to enhance the soldering strength of the solder balls at lower cost.

DESCRIPTION OF THE DRAWINGS

FIGS. 7A to 7H show cross sectional views of components during the manufacturing process of a leadframe-based BGA package according to the third embodiment of the present invention.

DETAIL DESCRIPTION OF THE INVENTION

Please refer to the attached drawings, and the present invention will be described by means of embodiment(s) below.

Figure 1:
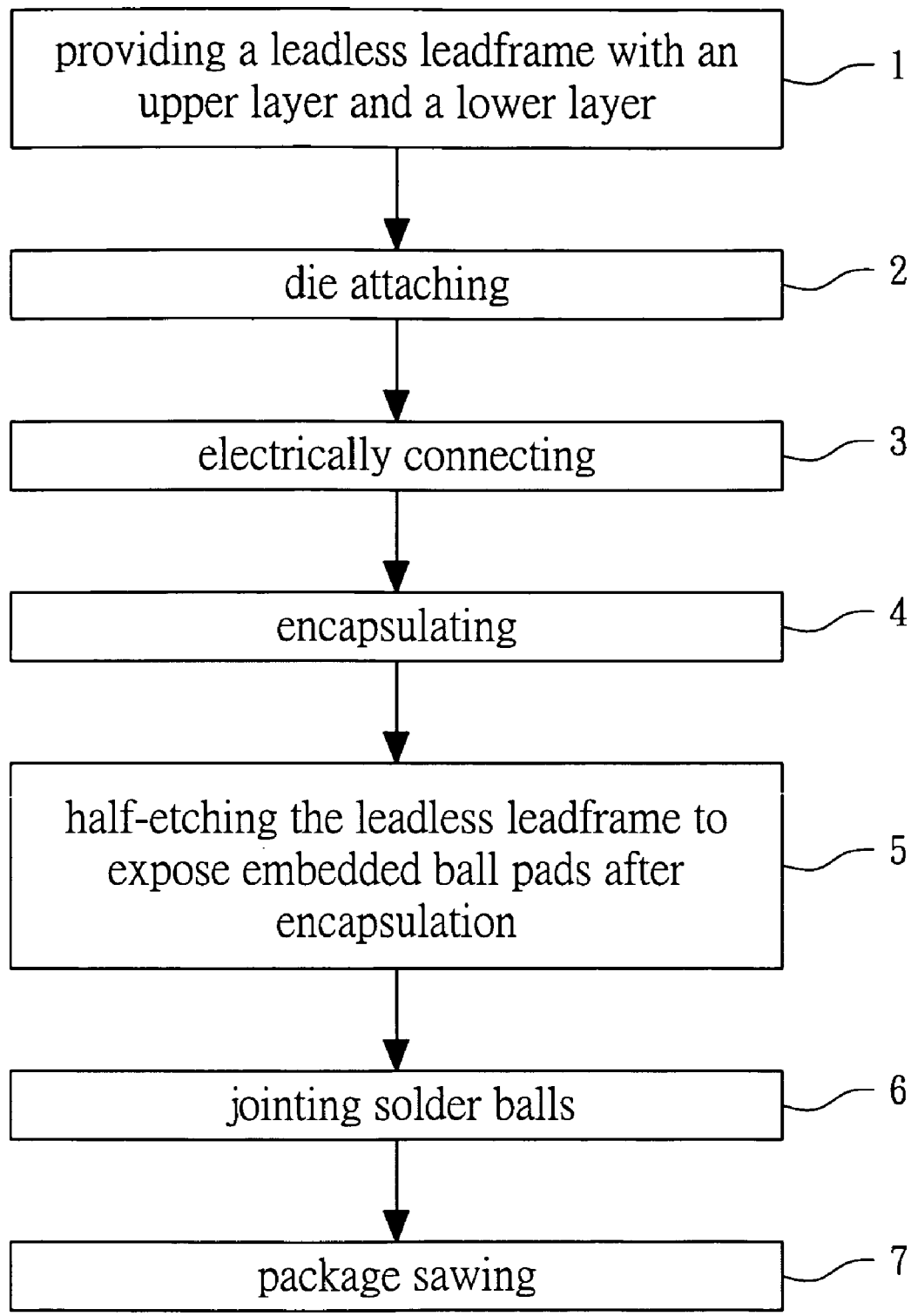
FIG. 1 shows a block diagram of the manufacturing process of a leadframe-based BGA package according to the present invention.

As shown in FIG. 1, the manufacturing process of a leadframe-based BGA package according to the present invention, comprises the following steps: step 1 of "providing a leadless leadframe with an upper layer and a lower layer"; step 2 of "die attaching"; step 3 of "electrically connecting the chip and the leadframe"; step 4 of "encapsulating"; step 5 of "half-etching the leadless leadframe to expose the embedded ball pads after encapsulation"; step 6 of "jointing solder balls", and step 7 of "package sawing". The detail descriptions are illustrated with FIG. 2A to FIG. 2G as follows.

Figure 2A:
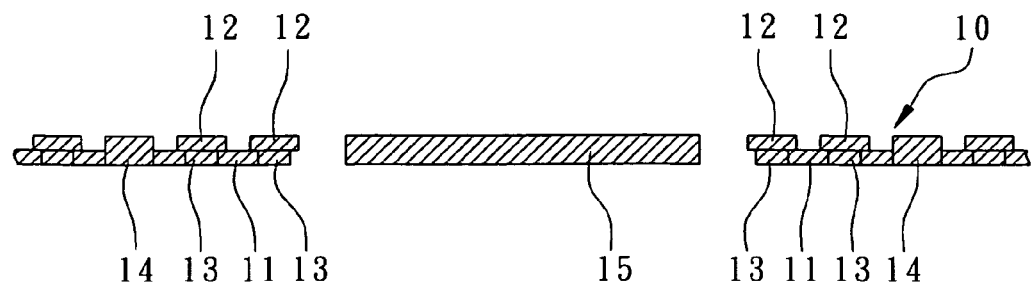
FIGS. 2A to 2G show cross sectional views of components during the manufacturing process of the leadframe-based BGA package according to the first embodiment of the present invention.
Figure 3:
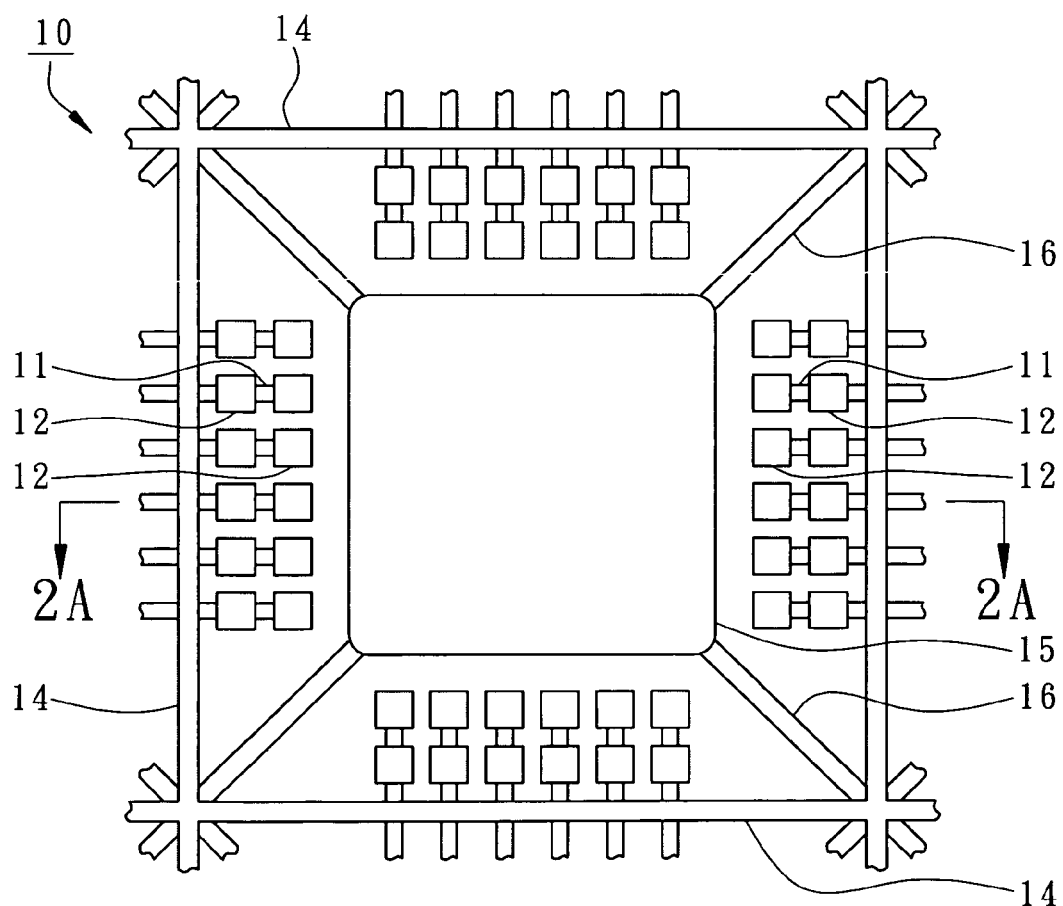
FIG. 3 shows a top view of a leadless leadframe used in the manufacturing process of the leadframe-based BGA package according to the first embodiment of the present invention.
Figure 4:
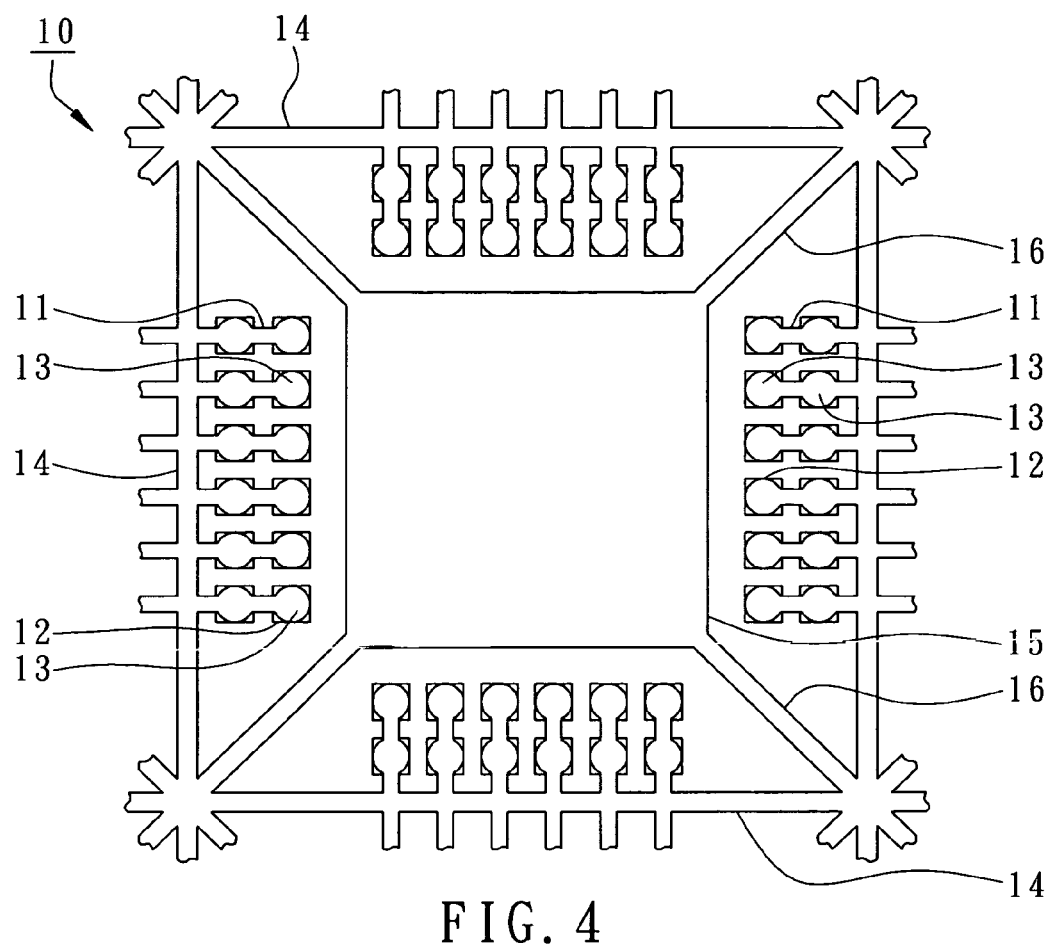
FIG. 4 shows a bottom view of the leadless leadframe according to the first embodiment of the present invention.

According to the first embodiment of the present invention, firstly, as shown in FIG. 2A, a leadless leadframe 10 with an upper layer and a lower layer is provided where a plurality of arrayed packaging units are defined thereupon to manufacture a plurality of leadframe-based BGA packages. As shown in FIGS. 3 and 4, in each packaging unit, the leadless leadframe 10 includes a plurality of leads 11 and a plurality of ball pads 12. The leads 11 are formed in the lower layer of the leadless leadframe 10. The ball pads 12 are formed in the upper layer of the leadless leadframe 10 and connect with the leads 11 through a plurality of sacrificial pads 13. The leads 11 further connect to the frame bars 14 disposed at the edges of the packaging unit to fix the ball pads 12. Preferably, as shown in FIG. 3, the ball pads 12 are disposed in array and each of the leads 11 connects at least two of the ball pads 12 to achieve a high-density layout of the ball pads 12. As shown in FIG. 2A and FIG. 4, the plurality of sacrificial pads 13 are formed in the lower layer of the leadless leadframe 10 where the sacrificial pads 13 align and connect with the ball pads 12 and are interconnected by the leads 11. In the present embodiment, the sacrificial pads 13 have a shape different from that of the ball pads 12. As shown in FIG. 4, the sacrificial pads 13 are round, whose diameter is greater than the width of the leads 11. The ball pads 12 can be square or in any shape. Preferably, the dimensions of the ball pads 12 are greater than that of the sacrificial pads 13 so that the peripheries of the bottom surfaces of the ball pads 12 are encapsulated to ensure the ball pads to be firmly secured in the encapsulant and to avoid moisture invasion, and the ball jointing areas are defined by the sacrificial pads 13. The leadless leadframe 10 might further includes at least a die pad 15 for the attachment of the chip 20 where the die pad 15 connects to the frame bars 14 through a plurality of tie bars 16. The leadless leadframe 10 can be prefabricated by attaching two different etching masks to both sides of a copper foil followed by an etching process. In the present embodiment, the die pad 15 is at least formed in the upper layer of the leadless leadframe 10, and the tie bars 16 are formed in the lower layer of the leadless leadframe 10, as shown in FIG. 3 and FIG. 4.

Figure 2B:
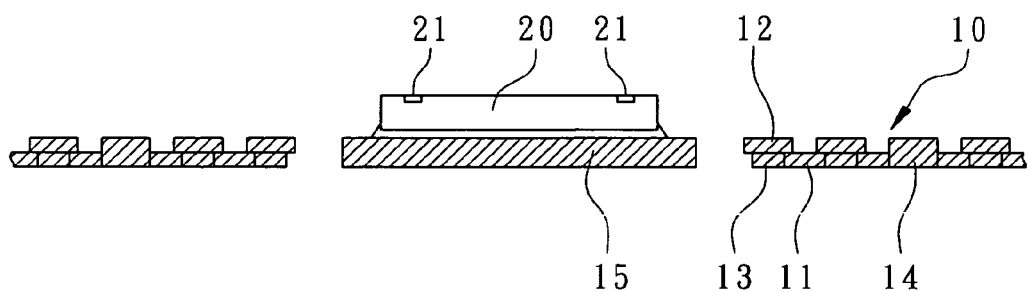

The die attaching step 2 is then performed. As shown in FIG. 2B, at least a chip 20 is attached to the die pad 15 on the upper layer of the leadless leadframe 10 where the chip 20 has a plurality of bonding pads 21 as the electrical terminals.

Figure 2C:
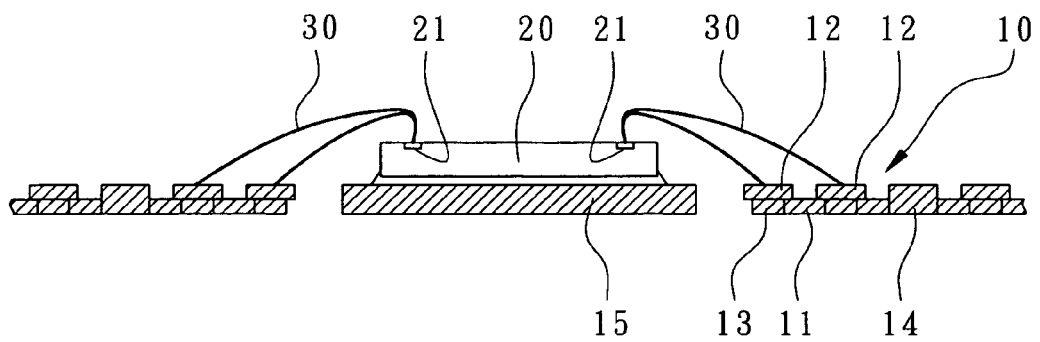

Step 3 is performed to electrically connect the chip 20 and the ball pads 12 by wire bonding or by flip chip technologies, which can be done after or along with step 2. The chip 20 is electrically connected to the leadless leadframe 10. In the present embodiment, as shown in FIG. 2C, a plurality of bonding wires 30 directly connect the bonding pads 21 of the chip 20 to the ball pads 12 of the leadless leadframe 10.

Figure 2D:
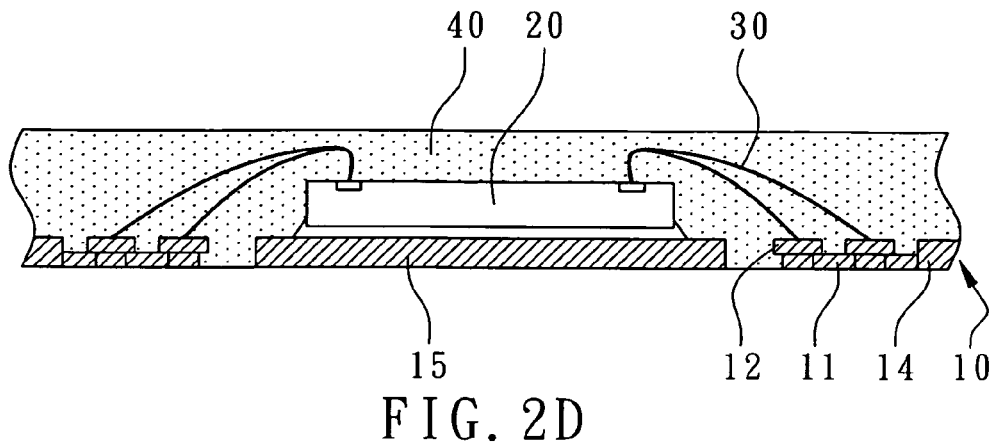

As shown in FIG. 2D, an encapsulant 40 is then formed on the leadless leadframe 10 to encapsulate the chip 20 and the bonding wires 30 by molding, printing, or dispensing, where transfer molding is the most practical to have a neat appearance of the encapsulant 40. A temporary tape, not shown in the figure, can be attached to the bottom surface of the lower layer of the leadless leadframe 10 before encapsulation and removed after the encapsulant 40 is cured. After the encapsulation process, the chip 20, the bonding wires 30 and the ball pads 12 are embedded inside the encapsulant 40. The bottom surfaces of the leads 11 and the sacrificial pads 13 are exposed from the bottom of the encapsulant 40. In this embodiment, the tie bars 16 are also exposed from the bottom of the encapsulant 40.

Figure 2E:
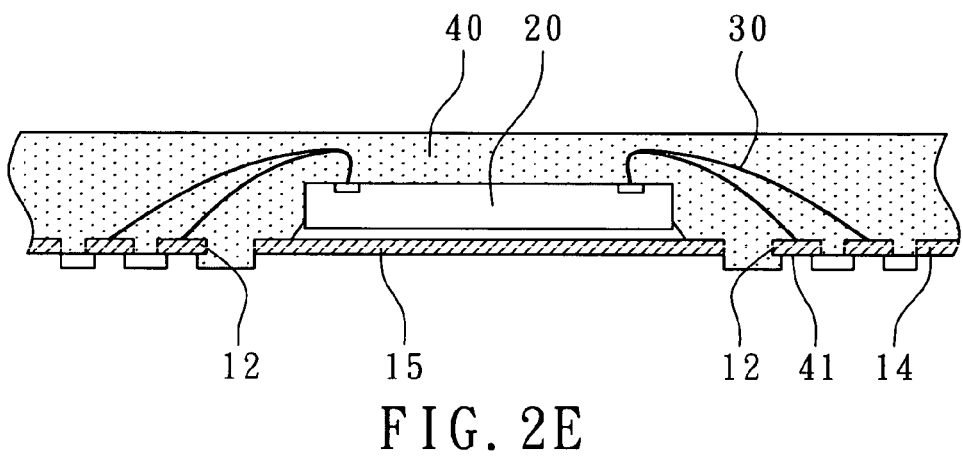
Figure 5:
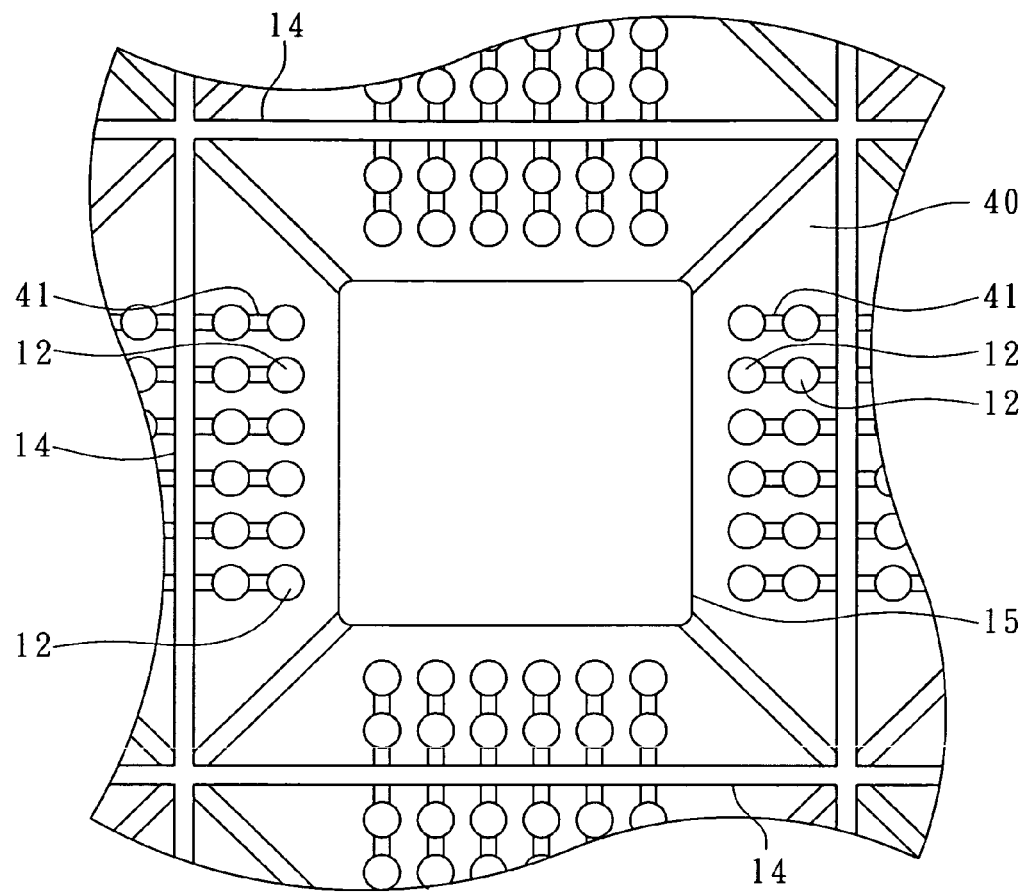
FIG. 5 shows a bottom view of the leadless leadframe after encapsulation and half-etching processes during manufacturing the leadframe-based BGA package according to the first embodiment of the present invention.

The half-etching step 5 is performed after the encapsulation step 4. The lower layer of the leadless leadframe 10 is then etched away by an etching solution such as $CuCl_2$. As shown in FIG. 2D and FIG. 2E, the leads 11 and the sacrificial pads 13 are etched away to make the embedded ball pads 12 electrically isolated and their bottom surfaces partially exposed from the encapsulant 40. In this embodiment, the die pad 15 is half-etched to be thinner during etching the tie bars 16. The die pad 15 is electrically isolated from the other parts of the leadless leadframe 10 after the tie bars 16 are removed. Etching away the leads 11 and the sacrificial pads 13 form a plurality of cavities 41 in the bottom of the encapsulant 40. As shown in FIG. 4, since the dimension of the sacrificial pads 13 is smaller than that of the ball pads 12, the exposed areas on the bottom surfaces of the ball pads 12 are hence defined by the etched sacrificial pads 13, as shown in FIG. 5. Therefore, the encapsulant 40 which has the functions of anti-soldering and anti-etching replaces the ordinary solder mask and further reduces the packaging cost. In the present embodiment, the peripheries of the bottom surfaces of the ball pads 12 are encapsulated by the encapsulant 40 to ensure the ball pads 12 firmly secured in the encapsulant 40 and to avoid moisture invasion. Moreover, once there is mold flash partially covering the bottom surfaces of the sacrificial pads 13, the thin layers of mold residues on the sacrificial pads 13 can be easily detected and removed after the sacrificial pads 13 are etched away in the half-etching step 5.

Figure 2F:
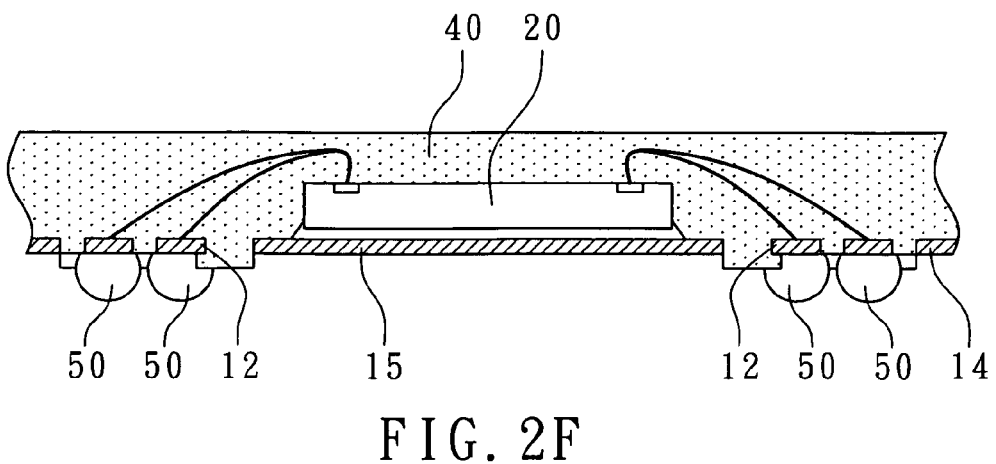
Figure 2G:
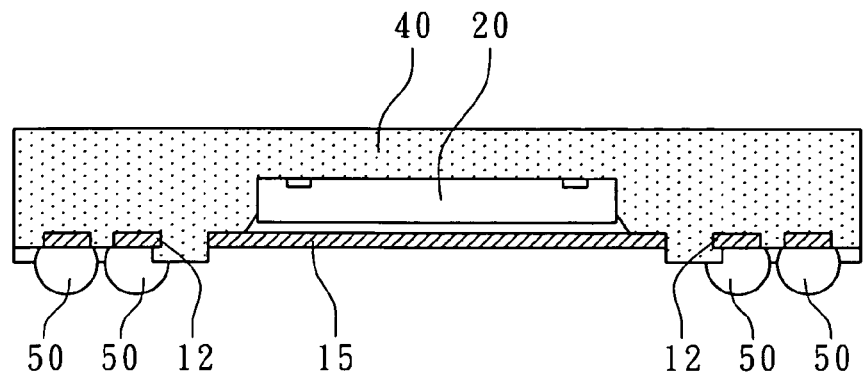

Then, the jointing solder balls step 6 is illustrated with FIG. 2F. A plurality of solder balls 50 are jointed on the ball pads 12 through the cavities 41. There are two ways to joint the solder balls 50. One is to place the preformed solder balls 50 on the ball pads 12 with flux, and through reflowing to make the solder balls 50 soldered on the exposed surfaces of the ball pads 12. The other is to print solder paste on the exposed surfaces of the ball pads 12, and then through reflowing to make the solder paste become solder balls 50 jointed on the ball pads 12. After reflowing, the solder balls 50 are partially embedded in the cavities 41 so that a better ball jointing strength can be achieved. Finally, the package sawing step 7 is performed. As shown in FIG. 2G, the frame bars 14 of the leadless leadframe 10 and the encapsulant 40 are cut along the peripheries of the packaging units to form a plurality of individual leadframe-based BGA packages.

Accordingly, during the packaging process, the ball pads 12 are provisionally interconnected and linked to the frame bars 14 by the leads 11. After encapsulation in step 4 and etching away the leads 11 in the half-etching step 5, the ball pads 12 become electrically isolated from each other and from the frame bars 14 but fixed inside the encapsulant 40 with their bottom surfaces partially exposed. Hence, during step 6 of "jointing solder balls", the fused solder balls 50 will not diffuse along the leads 11 causing the problems of insufficient heights of the solder balls 50 and bridging between solder balls 50. Moreover, the soldering areas of the ball pads 12 have been defined by the sacrificial pads 13 and the encapsulant 40 so that there is no need for solder masks to be formed on the lower layer of the leadless leadframe to define solder balls placing areas.

Preferably, as shown in FIGS. 3 and 4, since the tie bars 16 are formed in the lower layer of the leadless leadframe 10, they are removed along with the leads 11 during the half-etching step 5. When solder paste is formed under the exposed surfaces of the die pads 15, the diffusion of the solder paste along the tie bars 16 can be avoided.

Figure 6:
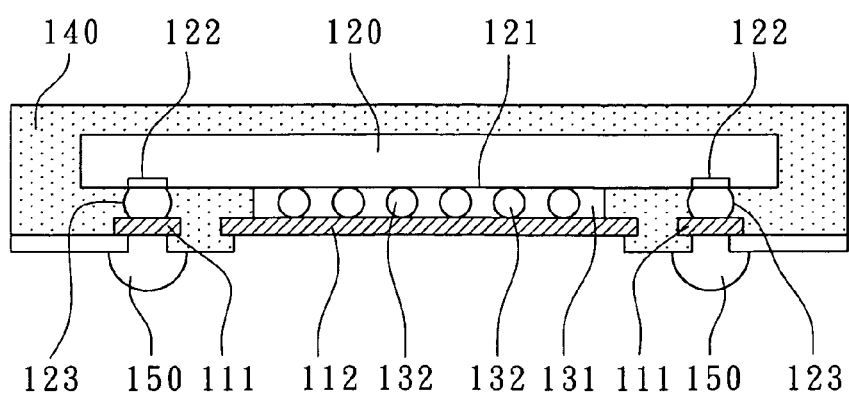
FIG. 6 shows a cross sectional view of another leadframe-based BGA package according to the second embodiment of the present invention.

A leadframe-based BGA package is revealed in FIG. 6 according to the second embodiment of the present invention. The BGA package has a flip-chip configuration and also can be manufactured by the same process as shown in FIG. 1. The main manufacturing steps are as the same as the first embodiment. The BGA package primarily comprises a leadless leadframe having an upper layer and a lower layer, a chip 120, an encapsulant 140, and a plurality of solder balls 150. The upper layer of the leadless leadframe includes a plurality of ball pads 111, and the lower layer of the leadless leadframe includes a plurality of leads and a plurality of sacrificial pads wherein the sacrificial pads align and connect with the ball pads and are interconnected by the leads. The lower layer of the leadless leadframe including the leads and the sacrificial pads is not shown in FIG. 6 since it has been removed during the half-etching process of step 5. In the present embodiment, the upper layer of the leadless leadframe further includes a die pad 112. A chip 120 is then attached onto the upper layer of the leadless leadframe in a flip chip manner where the active surface 121 of the chip 120 which has a plurality of bonding pads 122 electrically connects to the ball pads 111 of the leadless leadframe via a plurality of bumps 123 such as solder balls disposed on the bonding pads 122. Step 2 and step 3 are hence finished simultaneously. Preferably, during die-attaching step 2, a die-attaching film 131 with a plurality of equal-diameter ball spacers 132 is attached onto the die pad 112 and adheres the active surface 121 of the chip 120 to enhance the adhesion of the chip 120 and to define the standoff heights between the chip 120 and the leadless leadframe to ensure the same extent of collapse of the bumps 123. However, if the joint of bumps 123 and the leadless leadframe is done by eutectic bonding or with anisotropic adhesive, the die-attaching film 131 and the ball spacers 132 can be omitted. In the encapsulation step 4, the leadless leadframe is covered by the encapsulant 140 so that the ball pads 111 are embedded. Then the half-etching step 5 is performed after encapsulation to remove the leads and the sacrificial pads in the lower layer of the leadless leadframe so that the embedded ball pads 111 are electrically isolated from each other and their bottom surfaces are exposed from the bottom of encapsulant 140. Then, in step 6, a plurality of solder balls 150 are jointed on the ball pads 111. Therefore, it provides a cost-effective manufacturing process for the leadframe-based BGA packages without the use of solder masks since the soldering areas for the solder balls 150 have been defined by the exposed surfaces of the ball pads 111 embedded in the encapsulant 140. Moreover, mold flash can easily be detected and removed, and the soldering strength of the solder balls 150 can be enhanced.

A manufacturing process of a leadframe-based BGA package is revealed according to the third embodiment of the present invention. The primary process includes the steps shown in FIG. 1. The detail descriptions are illustrated with FIG. 7A to FIG. 7H as follows.

Figure 7A:
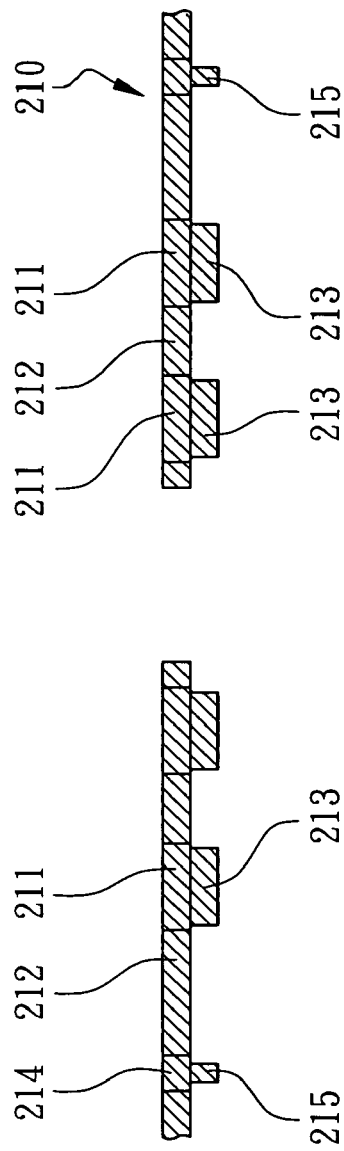

Firstly, in step 1 as illustrated in FIG. 7A, a leadless leadframe 210 having an upper layer and a lower layer prefabricated by etching processes is provided, where the upper layer includes a plurality of ball pads 211 and a plurality of leads 212 interconnecting the ball pads 211, and the lower layer includes a plurality of sacrificial pads 213 aligning and connecting with the ball pads 211. Normally, the leads 212 are made of metal such as copper, iron, or its alloy. The ball pads 211 and the leads 212 can be formed by a punching or an etching process, and the sacrificial pads 213 are formed by a selective half-etching process on the lower layer of the leadless leadframe 210. To be more specific, the leads 212 are formed in the upper layer of the leadless leadframe 210 by etching away the portions excluding the sacrificial pads 213 on the lower layer of the leadless leadframe 210. Moreover, the sacrificial pads 213 can be round with a dimension smaller than that of the ball pads 211 so that the leads 212 in the upper layer have no direct connection with the sacrificial pads 213. The ball pads 211 can be square or in any other shapes.

Figure 7B:
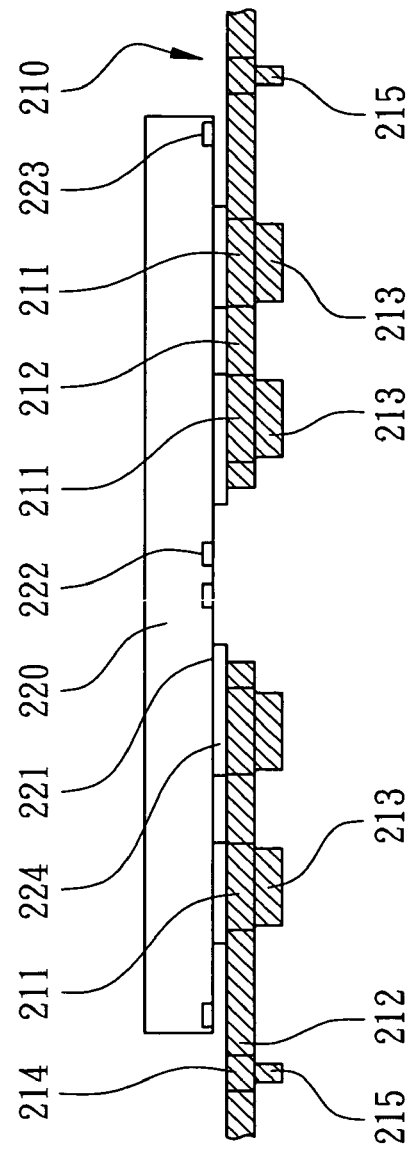

In the die-attaching step 2 as illustrated in FIG. 7B, at least a chip 220 is attached onto the upper layer of the leadless leadframe 210. The chip 220 has an active surface 221 and a plurality of first bonding pads 222 and a plurality of second bonding pads 223 formed on the active surface 221, where the first bonding pads 222 can be disposed on the central area of the active surface 221 and the second bonding pads 223 can be on the peripheral areas. The active surface 221 is attached to the top surfaces of the leads 212, i.e., the upper layer of the leadless leadframe 210, by a die-attaching paste 224. The die-attaching paste 224 can be a B-staged paste or a die-attaching film and is pre-formed on the active surface 221 of the chip 220 or on the top surfaces of the leads 212.

The electrically connecting step 3 can be performed during or after the die-attaching step 2. As shown in FIG. 7C, the electrical connection between the chip 220 and the ball pads 211 of the leadless leadframe 210 is accomplished by a plurality of bonding wires 230. The bonding wires 230 connect the first bonding pads 222 and the second bonding pads 223 to the leads 212 so that the signals, power, and grounding of the chip 220 can be electrically connected to the corresponding leads 212. The bonding wires 230 are thin, long, and flexible metal wires formed by wire-bonding technologies such as ultrasonic bonding (U/S), thermocompression bonding (T/C), or thermosonic bonding (T/C).

Then, the encapsulation step 4 is performed. As shown in FIG. 7D, the encapsulant 240 is formed on the leadless leadframe 210 by molding or printing. The encapsulant 240 encapsulates the leads 212, the chip 220, the die-attaching paste 224, and the bonding wires 230 and leaves the bottom surfaces of the sacrificial pads 213 being exposed. The ball pads 211 are embedded in the encapsulant 240. In this embodiment, the bottom of the encapsulant 240 is flat. Furthermore, the bottom surfaces of the leads 212 can be encapsulated by the encapsulant 240 so that the bonding capability of the leads 210 is increased and solder bleeding on the leads is avoided. Preferably, the bottom surfaces of the leads 212 are completely encapsulated to avoid the leads 212 exposed from the encapsulant 240 leading to lead breakage in step 5.

Figure 7E:
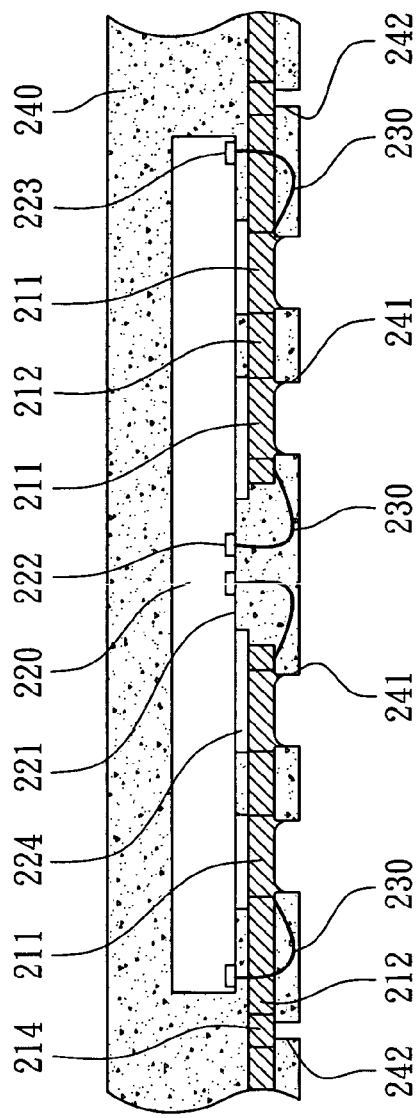
Figure 7F:
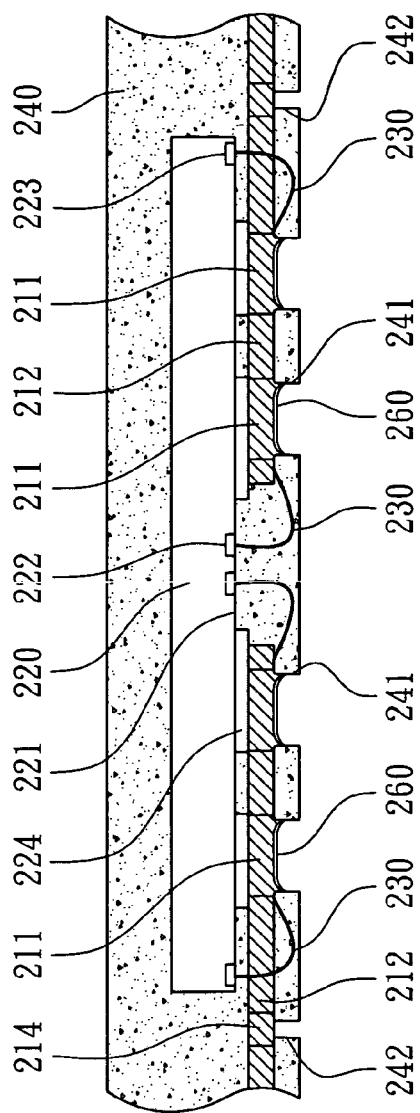

Then, the half-etching step 5 is performed after forming the encapsulant 240. As shown in FIG. 7E, the sacrificial pads 213 are removed to form a plurality of cavities 241 on the bottom of the encapsulant 240. The bottom surfaces of the embedded ball pads 211 inside the encapsulant 240 are partially exposed from the cavities 241. Preferably, the exposed surfaces of the ball pads 211 show a concave face instead of a planar one so that the jointing areas of solder balls are increased leading to better ball joint strengths. Since the dimensions of the sacrificial pads 213 are smaller than that of the ball pads 211, the areas of the exposed surfaces of the ball pads 211 are defined by the sacrificial pads 213 and the leads 212 are not exposed in the cavities 241 after the half-etching step 5 so that the encapsulant 240 serves as a solder mask and an anticorrosive component, which reduces the packaging cost due to the omission of solder masks. Preferably, the peripheries of the bottom surfaces of the ball pads 211 are encapsulated by the encapsulant 240 to ensure the ball pads 211 to be firmly secured inside the encapsulant 240 and to avoid moisture invasion. Preferably, as shown in FIG. 7A and FIG. 7E, the leadless leadframe 210 further comprises a plurality of probing pads 214 formed in the upper layer where the probing pads 214 are electrically connected to the corresponding ball pads 211 through the leads 212. The leadless leadframe 210 further comprises a plurality of peripheral sacrificial pads 215 formed in the lower layer and aligning and connecting with the probing pads 214, where the peripheral sacrificial pads 215 are removed after the above-mentioned half-etching step 5 to form a plurality of peripheral cavities 242 on the bottom of the encapsulant 240 to expose the embedded probing pads The probing pads 214 are configured for electrical testing.

In the present embodiment, the manufacturing process further comprises a step of forming a plating layer between the half-etching process of step 5 and the ball-jointing process of step 6. As shown in FIG. 7E, a plating layer 260 is formed on the exposed surfaces of the ball pads 211 by electroplating technology. The plating layer 260 can be chosen from the group of nickel-gold, tin, nickel-palladium-gold, tin-lead, silver, tin-bismuth, etc.

Figure 7G:
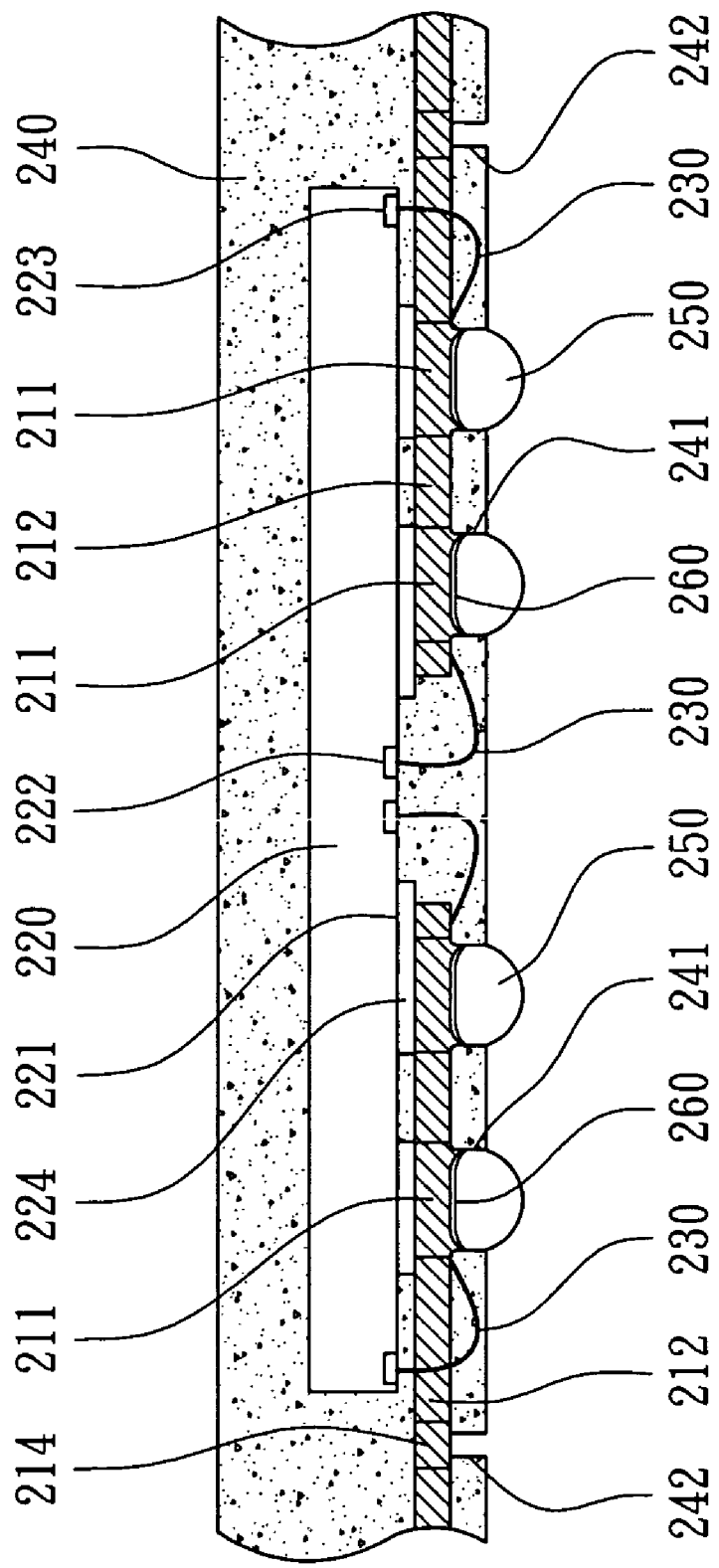

Then, step 6 is performed to joint a plurality of solder balls. As shown in FIG. 7G, the solder balls 250 are jointed on the ball pads 211 by reflowing. The solder balls 250 are partially embedded in the cavities 241 to get better ball joint strengths.

Figure 7H:
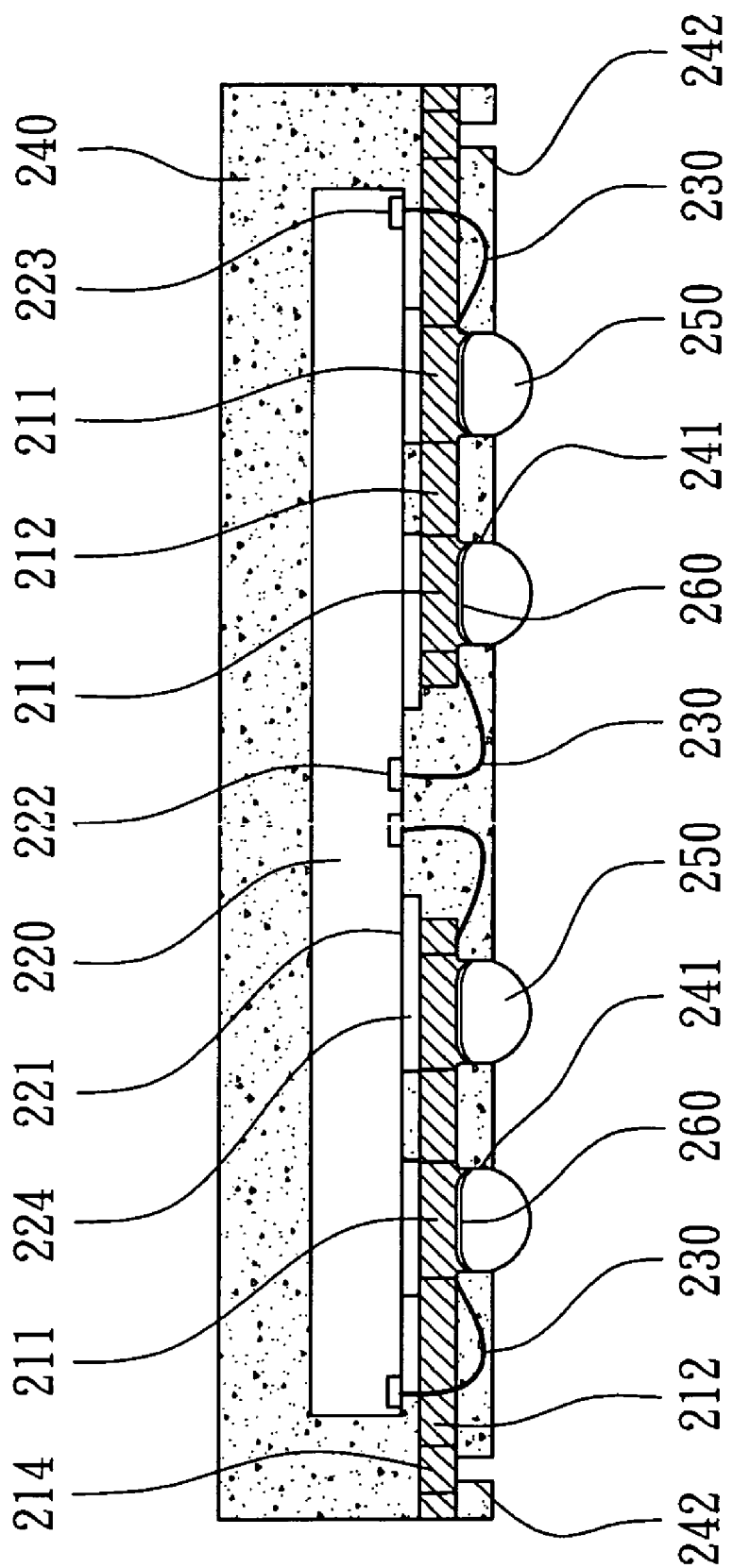

Finally, the package-saw step 7 is performed. As shown in FIG. 7H, the leads 212 of the leadless leadframe 210 and the encapsulant 240 are cut along the packaging units of the leadless leadframe 210 to singulate the leadframe-based BGA packages.

Therefore, through the above-mentioned processes, conventional issues regarding insufficient heights or undesired deformation of the solder balls 250 and electrical short between the solder balls 250/leads 212 caused by unrestrained bleeding of fused solder during reflowing are resolved. Moreover, the solder ball jointing areas, i.e., the exposed areas of the ball pads 211 can be pre-defined by the sacrificial pads 213 without the use of solder masks.

The above description of embodiments of this invention is intended to be illustrative and not limiting. Other embodiments of this invention will be obvious to those skilled in the art in view of the above disclosure.

What is claimed is:

1. A manufacturing process of a leadframe-based BGA package, comprising the steps of:
    providing a leadless leadframe with an upper layer and a lower layer, wherein the upper layer includes a plurality of ball pads and the lower layer includes a plurality of leads and a plurality of sacrificial pads, the sacrificial pads align and connect with the ball pads and are interconnected by the leads;
    attaching at least a chip onto the upper layer of the leadless leadframe;
    electrically connecting the chip to the ball pads of the leadless leadframe;
    encapsulating the leadless leadframe so that the ball pads are embedded inside the encapsulant and the bottom surfaces of the leads and the sacrificial pads are exposed from the bottom of the encapsulant;
    half-etching the leadless leadframe after encapsulation to remove the leads and the sacrificial pads and to electrically isolate the ball pads and expose the bottom surfaces of the ball pads; and
    jointing a plurality of solder balls on the ball pads.

2. The manufacturing process of claim 1, wherein the ball pads are disposed in array and each lead interconnects at least two of the ball pads.

3. The manufacturing process of claim 1, wherein the sacrificial pads are round with a dimension smaller than the ball pads.

4. The manufacturing process of claim 3, wherein the ball pads are square and the peripheries of the bottom surfaces of the ball pads are encapsulated by the encapsulant.

5. The manufacturing process of claim 1, further comprising a package-sawing step for forming a plurality of individual leadframe-based BGA packages by cutting the leadless leadframe and the encapsulant.

6. The manufacturing process of claim 1, wherein the leadless leadframe further includes at least a die pad for the disposition of the chip.

7. The manufacturing process of claim 6, wherein the leadless leadframe further includes a plurality of tie bars connecting to the die pad.

8. The manufacturing process of claim 7, wherein the tie bars are formed in the lower layer and are etched away during the half-etching step.

9. The manufacturing process of claim 6, wherein the die pad is at least formed in the upper layer.

10. The manufacturing process of claim 1, wherein the electrically connecting step includes forming a plurality of bonding wires directly connecting a plurality of bonding pads of the chip and the ball pads.

11. The manufacturing process of claim 6, wherein the chip-attaching step includes attaching a die-attaching film with a plurality of equal-diameter ball spacers onto the die pad to adhere an active surface of the chip.

12. A manufacturing process of a leadframe-based BGA package, comprising the steps of:
    providing a leadless leadframe with an upper layer and a lower layer, wherein the upper layer includes a plurality of ball pads and a plurality of leads, the lower layer includes a plurality of sacrificial pads, the ball pads align and connect with the sacrificial pads and are interconnected by the leads;
    attaching at least a chip onto the upper layer of the leadless leadframe;

electrically connecting the chip to the leads of the leadless leadframe;

encapsulating the leadless leadframe so that the ball pads and the leads are embedded inside the encapsulant and the bottom surfaces of the sacrificial pads are exposed from the bottom of the encapsulant;

half-etching the leadless leadframe after encapsulation to remove the sacrificial pads so that the ball pads are exposed from a plurality of cavities on the bottom of the encapsulant which are formed by the removal of the sacrificial pads; and jointing a plurality of solder balls on the ball pads.

13. The manufacturing process of claim 12, wherein the sacrificial pads are formed by executing a selective half-etching process to a leadless leadframe before the encapsulation.

14. The manufacturing process of claim 12, wherein the sacrificial pads are round with a dimension smaller than the ball pads.

15. The manufacturing process of claim 14, wherein the ball pads are square and the peripheries of the bottom surfaces of the ball pads are encapsulated by the encapsulant.

16. The manufacturing process of claim 12, further comprising a package-sawing step for forming a plurality of individual leadframe-based BGA packages by cutting the leadless leadframe and the encapsulant.

17. The manufacturing process of claim 12, wherein an active surface of the chip is attached to the top surfaces of the leads and the encapsulant further encapsulates the bottom surfaces of the leads.

18. The manufacturing process of claim 12, further comprising the step of forming a plating layer on the exposed surfaces of the ball pads after the half-etching step after encapsulation.

19. The manufacturing process of claim 12, wherein the upper layer further includes a plurality of probing pads electrically connected to the corresponding ball pads by the leads, the lower layer further includes a plurality of peripheral sacrificial pads aligning and connecting with the probing pads, the peripheral sacrificial pads are also removed during the half-etching step after encapsulation to expose the probing pads.

* * * * *